United States Patent
Lee et al.

(10) Patent No.: US 12,105,146 B2
(45) Date of Patent: Oct. 1, 2024

(54) WAFER-LEVEL MULTI-DEVICE TESTER AND SYSTEM INCLUDING THE SAME PRELIMINARY CLASS

(71) Applicant: Samsung Electronics Co., Ltd., Suwon-si (KR)

(72) Inventors: Seongkwan Lee, Suwon-si (KR); Hyungsun Ryu, Suwon-si (KR); Kangmin Lee, Suwon-si (KR); Jaemoo Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/299,265

(22) Filed: Apr. 12, 2023

(65) Prior Publication Data

US 2024/0085478 A1    Mar. 14, 2024

(30) Foreign Application Priority Data

Sep. 13, 2022    (KR) .......................... 10-2022-0114735

(51) Int. Cl.
*G01R 31/319*    (2006.01)
*G01R 31/28*    (2006.01)

(52) U.S. Cl.
CPC ... *G01R 31/31926* (2013.01); *G01R 31/2844* (2013.01)

(58) Field of Classification Search
CPC ...................... G01R 31/31926; G01R 31/2844
See application file for complete search history.

(56) References Cited

U.S. PATENT DOCUMENTS

| 10,459,348 B2 | 10/2019 | Jung et al. | |
| 2007/0159532 A1 | 7/2007 | Kiyokawa | |
| 2011/0279109 A1* | 11/2011 | Masuda | G01R 31/31917 324/96 |
| 2012/0136614 A1 | 5/2012 | Liu et al. | |
| 2014/0145745 A1 | 5/2014 | Ryu et al. | |
| 2014/0336974 A1* | 11/2014 | Jochen | G01R 31/31908 702/117 |
| 2017/0048133 A1* | 2/2017 | Walker | H04L 43/087 |
| 2021/0111967 A1* | 4/2021 | Pham | G06F 13/4282 |
| 2021/0239736 A1 | 8/2021 | Tsai et al. | |
| 2023/0326591 A1* | 10/2023 | Wade | G16H 10/60 382/128 |

FOREIGN PATENT DOCUMENTS

| KR | 102202074 B1 | 1/2021 |
| KR | 20210056780 A | 5/2021 |

* cited by examiner

*Primary Examiner* — Thien Nguyen

(74) *Attorney, Agent, or Firm* — Myers Bigel, P.A.

(57) ABSTRACT

A tester, which is adapted to test a device under test (DUT), includes a first plurality of signal analysis circuits configured to analyze signals generated by a plurality of DUTs, and a second plurality of signal processing units configured to process the signals analyzed by the first plurality of signal analysis circuits. A switch array is provided, which is electrically coupled between the first plurality of signal analysis circuits and the second plurality of signal processing units. The switch array is configured to electrically connect selected ones of the first plurality of signal analysis circuits with corresponding ones of the second plurality of signal processing units. The number of signal processing units within the second plurality may be less than a maximum number of DUTs that can be connected to the first plurality of signal analysis circuits when the tester is testing a plurality of the DUTs.

11 Claims, 5 Drawing Sheets

WAFER-LEVEL MULTI-DEVICE TESTER AND SYSTEM INCLUDING THE SAME PRELIMINARY CLASS

REFERENCE TO PRIORITY APPLICATION

This application claims priority under 35 USC § 119 to Korean Patent Application No. 10-2022-0114735, filed Sep. 13, 2022, the disclosure of which is hereby incorporated herein by reference.

BACKGROUND

Example embodiments relate to a tester and a test system including the same. More particularly, example embodiments relate to a tester configured to test a plurality of integrated circuits on a semiconductor wafer, as corresponding "devices under test" (DUT), and a test system including the tester.

Generally, a tester may test DUTs on a wafer. The tester may apply a test signal(s) to the DUTs. In response, the tester may analyze and process signals generated by the DUTs in response to the test signals. Typically, the tester may include circuits configured to analyze the signals from the DUTs and signal processing units configured to process the signals analyzed by the circuits.

According to related arts, the number of signal processing units within the tester may be substantially the same as a maximum number of DUTs that may be tested by the tester. However, when a probe card configured to transmit test signals to the DUTs tests an edge portion of the wafer, the probe card may make contact with a portion of the wafer without any DUT Thus, at least some of the signal processing units may not be used during testing of DUTs adjacent an edge portion of the wafer.

SUMMARY

Example embodiments provide a tester that may be capable of improving a utilization ratio of signal processing units.

Example embodiments also provide a test system including an enhanced tester that supports an improved utilization ratio of signal processing units therein.

According to example embodiments, a tester may include a plurality of signal analysis circuits, a plurality of signal processing units and a switch array. The signal analysis circuits may analyze signals generated by a plurality of devices under test (DUTs) within a wafer. The signal processing units may process signals analyzed by the signal analysis circuits. The number of signal processing units may be less than the maximum of number of the DUTs that may be connected to the tester. The switch array may be arranged between the signal analysis circuits and the signal processing units. The switch array may selectively connect the signal analysis circuits with the signal processing units in accordance with connections between the DUTs and the signal analysis circuits.

According to additional embodiments, a tester may be provided, which includes a plurality of field programmable gate arrays (FPGA), a plurality of graphic processing units (GPU), a switch array and a switch controller. The FPGAs may analyze signals generated from a plurality of DUTs within a wafer. The GPUs may process signals analyzed by the FPGAs. The total number of GPUs may be less than the maximum number of DUTs that may be attached to the tester. The switch array may be arranged between the FPGAs and the GPUs. The switch array may selectively connect the FPGAs with the GPUs in accordance with connections between the DUTs and the FPGAs. The switch controller may detect the connections between the DUTs and the FPGAs to control the switch array.

According to further embodiments, a test system may be provided, which includes at least two testers, a switch hub and a signal-processing server. Each of the testers may include a plurality of signal analysis circuits, a plurality of signal processing units and a switch array. The signal analysis circuits may analyze signals generated by a plurality of DUTs of a wafer. The signal processing units may process signals analyzed by the signal analysis circuits. A maximum number of the signal processing units may be less than a maximum number of DUTs connected to a corresponding tester. The switch array may be arranged (and electrically connected) between the signal analysis circuits and the signal processing units. The switch array may selectively connect the signal analysis circuits with the signal processing units in accordance with connections between the DUTs and the signal analysis circuits. The switch hub may be connected to the testers to electrically connect the switch arrays with each other. The signal-processing server may be connected with the switch hub.

According to still further embodiments, the switch array may cut off a connection of any one among connections between the signal analysis circuits, which may not be connected to the DUT, and the signal processing units. Thus, the DUTs may be tested using the signal processing units having numbers less than the maximum numbers of the DUTs. Further, the single switch hub may be connected with the at least two testers so that the signal processing unit in any one of the testers may be utilized for the signal processing unit of the other tester. As a result, numbers of the signal processing units may be decreased to reduce costs of the tester and the test system.

BRIEF DESCRIPTION OF THE DRAWINGS

Example embodiments will be more clearly understood from the following detailed description taken in conjunction with the accompanying drawings.

FIG. 1 is a block diagram illustrating a tester applied to DUTs at a central portion of a wafer in accordance with example embodiments;

FIG. 2 is a block diagram illustrating a tester applied to DUTs at an edge portion of a wafer in accordance with example embodiments;

FIG. 3 is a block diagram illustrating a test system including the tester in FIG. 2;

FIG. 4 is a block diagram illustrating an operation of utilizing signal processing units by a signal processing server in FIG. 3;

FIG. 5 is a block diagram illustrating a test system in accordance with example embodiments; and FIG. 6 is a block diagram illustrating a test system in accordance with example embodiments.

DETAILED DESCRIPTION OF THE EMBODIMENTS

Hereinafter, example embodiments will be explained in detail with reference to the accompanying drawings.

Figure 1:
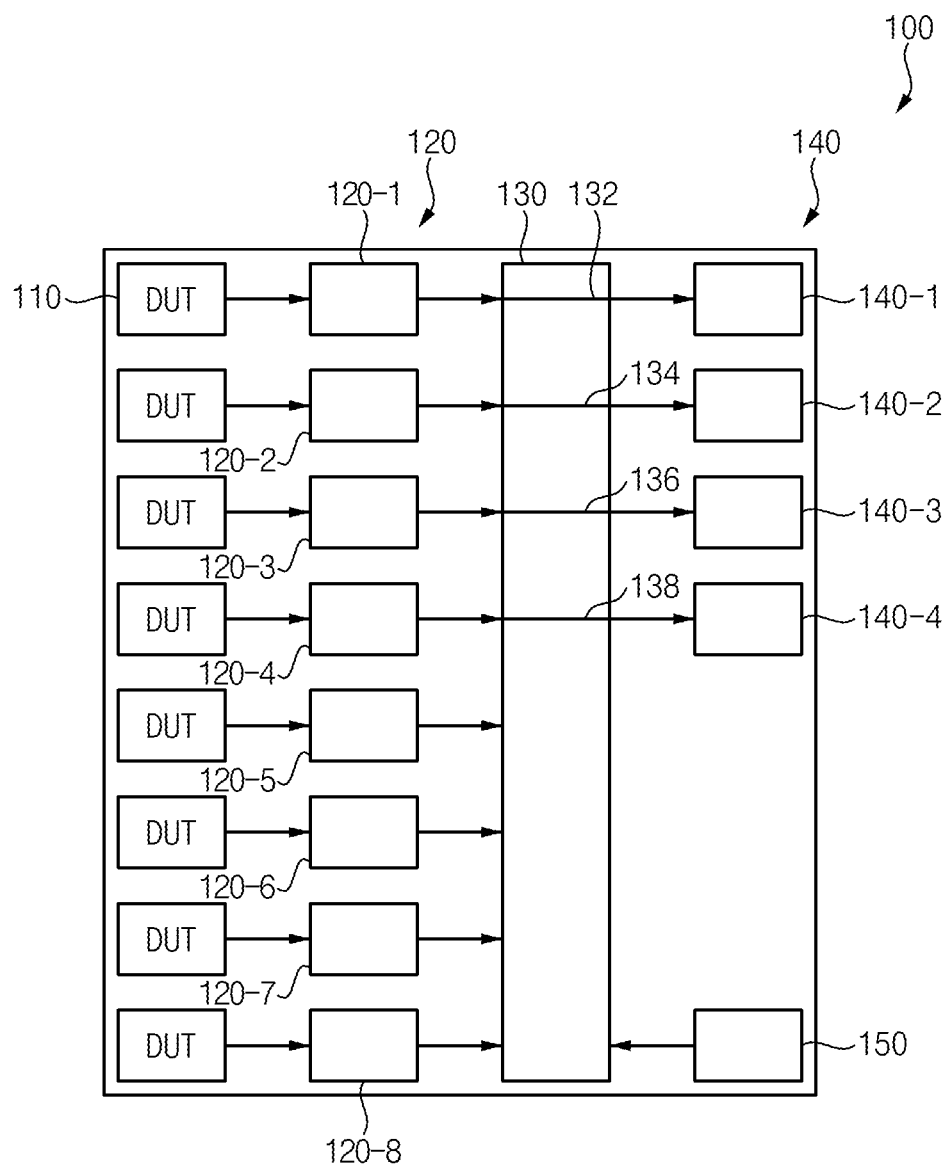
FIGS. 1 to 6 represent non-limiting, example embodiments as described herein.

FIG. 1 is a block diagram illustrating a tester applied to DUTs at a central portion of a wafer in accordance with example embodiments. Referring to FIG. 1, a tester 100 of example embodiments may test DUTs 110 formed on a wafer. Particularly, the tester 100 may apply a test signal to the DUTs 110 through a probe card. The tester 100 may determine whether the DUTs 110 may be normal or not based on signals outputted from the DUTs 110. In example embodiments, the DUTs may be eight, but other numbers of DUTs may also be used.

The tester 100 may include a plurality of signal analysis circuits 120, a plurality of signal processing units 140, a switch array 130 and a switch controller 150. The signal analysis circuits 120 may be electrically connected to the DUTs 110; the signal analysis circuits 120 may analyze the signals outputted from the DUTs 110. In some embodiments, the signal analysis circuits 120 may include a field programmable gate array (FPGA), but is not limited thereto. The signal analysis circuits 120 may correspond to the DUTs 110 in one-to-one relation. That is, the number of the signal analysis circuits 120 may be substantially the same as the maximum number of the DUTs 110 connected to the tester. Thus, because the numbers of the DUTs 110 may be eight, the numbers of the signal analysis circuits 120 may also be eight. In example embodiments, the signal analysis circuits 120 may include first to eighth signal analysis circuits 120-1, 120-2, 120-3, 120-4, 120-5, 120-6, 120-7 and 120-8. The signal processing units 140 may be selectively connected to the signal analysis circuits 120. The signal processing units 140 may process signals analyzed by the signal analysis circuits 120. The signal processing units 140 may determine whether the DUTs 110 may be normal or not based on the processed signals. In example embodiments, the signal processing units 140 may include graphic processing units (GPUs), but is not limited thereto.

In example embodiments, the numbers of the signal processing units 140 may be less than the numbers of the DUTs 110. Because the numbers of the signal analysis circuits 120 may be substantially the same as the numbers of the DUTs 110, the numbers of the signal processing units 140 may also be less than the numbers of the signal analysis circuits 120. Thus, at least one DUT 110, which may not be connected to the signal-processing unit 140, may exist.

Further, when the numbers of the DUTs 110 may be N (N is a natural number), the numbers of the signal processing units 140 may be no more than (N−1). That is, when the numbers of the DUTs 110 may be eight, the numbers of the signal processing units 140 may be one to seven. In example embodiments, the numbers of the signal processing units 140 may be four, but is not limited thereto. In this case, the signal processing units 140 may include first to fourth signal processing units 140-1, 140-2, 140-3 and 140-4.

The switch array 130 may be arranged between the signal analysis circuits 120 and the signal processing units 140. The switch array 130 may selectively connect the signal analysis circuits 120 with the signal processing units 140 in accordance with connections between the DUTs 110 and the signal analysis circuits 120. In particular, the switch array 130 may connect only the signal analysis circuit 120, which may be connected to the DUT 110, among the signal analysis circuits 120 with the signal-processing unit 140. In contrast, the switch array 130 may not connect the signal analysis circuit 120, which may not be connected to the DUT 110, among the signal analysis circuits 120 with the signal-processing unit 140. That is, the switch array 130 may cut off an electrical connection between the signal analysis circuit 120, which may not be connected to the DUT 110, and the signal-processing unit 140.

The switch array 130 may include a plurality of switches. The switches may be configured to selectively connect the signal analysis circuits 120 with the signal processing units 140. Thus, the total number of switches may be substantially the same as the numbers of the signal processing units 140. Alternatively, the numbers of the switches may be greater than the numbers of the signal processing units 140.

In example embodiments, because the numbers of the signal processing units 140 may be four, the numbers of the switches may also be four. Thus, the switch array 130 may include first to fourth switches 132, 134, 136 and 138. Particularly, the first switch 132 may be arranged between the first signal analysis circuit 120-1 and the first signal-processing unit 140-1 to selectively connect the first signal analysis circuit 120-1 with the first signal-processing unit 140-1. The second switch 134 may be arranged between the second signal analysis circuit 120-2 and the second signal-processing unit 140-2 to selectively connect the second signal analysis circuit 120-2 with the second signal-processing unit 140-2. The third switch 136 may be arranged between the third signal analysis circuit 120-3 and the third signal-processing unit 140-3 to selectively connect the third signal analysis circuit 120-3 with the third signal-processing unit 140-3. The fourth switch 138 may be arranged between the fourth signal analysis circuit 120-4 and the fourth signal-processing unit 140-4 to selectively connect the fourth signal analysis circuit 120-4 with the fourth signal-processing unit 140-4.

The switch controller 150 may be configured to control the operations of the switch array 130. Particularly, the switch controller 150 may detect the connections between the DUTs 110 and the signal analysis circuits 120. The switch controller 150 may control the operation of each of the switches in accordance with the connection between each of the DUTs 110s and each of the signal analysis circuits 120. The connection between the DUT 110 and the signal analysis circuit 120 may correspond to an existence of the DUT 110 connected to the signal analysis circuit 120.

In example embodiments, because the DUTs 110 may be arranged in a central portion of the wafer, all the signal analysis circuits 120 may be connected to the DUTs 110. That is, the first to eighth signal analysis circuits 120-1, 120-2, 120-3, 120-4, 120-5, 120-6, 120-7 and 120-8 may be connected to the DUTs 110. The switch controller 150 may detect the connection between the first to eighth signal analysis circuits 120-1, 120-2, 120-3, 120-4, 120-5, 120-6, 120-7 and 120-8 and the DUTs 110. The switch array 130 may connect the first to fourth signal analysis circuits 120-1, 120-2, 120-3 and 120-4 connected to the DUTs 110 with the first to fourth signal processing units 140-1, 140-2, 140-3 and 140-4, respectively, by the controls of the switch controller 150. That is, the first switch 132 may connect the first signal analysis circuit 120-1 connected to the DUT 110 with the first signal processing unit 140-1. The second switch 134 may connect the second signal analysis circuit 120-2 connected to the DUT 110 with the second signal processing unit 140-2. The third switch 136 may connect the third signal analysis circuit 120-3 connected to the DUT 110 with the third signal processing unit 140-3. The fourth switch 138 may connect the fourth signal analysis circuit 120-4 connected to the DUT 110 with the fourth signal processing unit 140-4.

In example embodiments, although the fifth to eighth signal analysis circuits 120-5, 120-6, 120-7 and 120-8 may be connected to the DUTs 110, the signal processing units 140 connected to the fifth to eighth signal analysis circuits 120-5, 120-6, 120-7 and 120-8 may not exist, because the numbers of the signal processing units 140 may be four. After the operations of the first to fourth signal processing units 140-1, 140-2, 140-3 and 140-4 with respect to the first to fourth signal analysis circuits 120-1, 120-2, 120-3 and 120-4 may be completed, the fifth to eighth signal analysis circuits 120-5, 120-6, 120-7 and 120-8 may be connected with the first to fourth signal processing units 140-1, 140-2, 140-3 and 140-4 through the first to fourth switches 132, 134, 136 and 138. Thus, the DUTs 110 connected to the fifth to eighth signal analysis circuits 120-5, 120-6, 120-7 and 120-8 may be tested after testing the DUTs 110 connected to the first to fourth signal analysis circuits 120-1, 120-2, 120-3 and 120-4.

Figure 2:
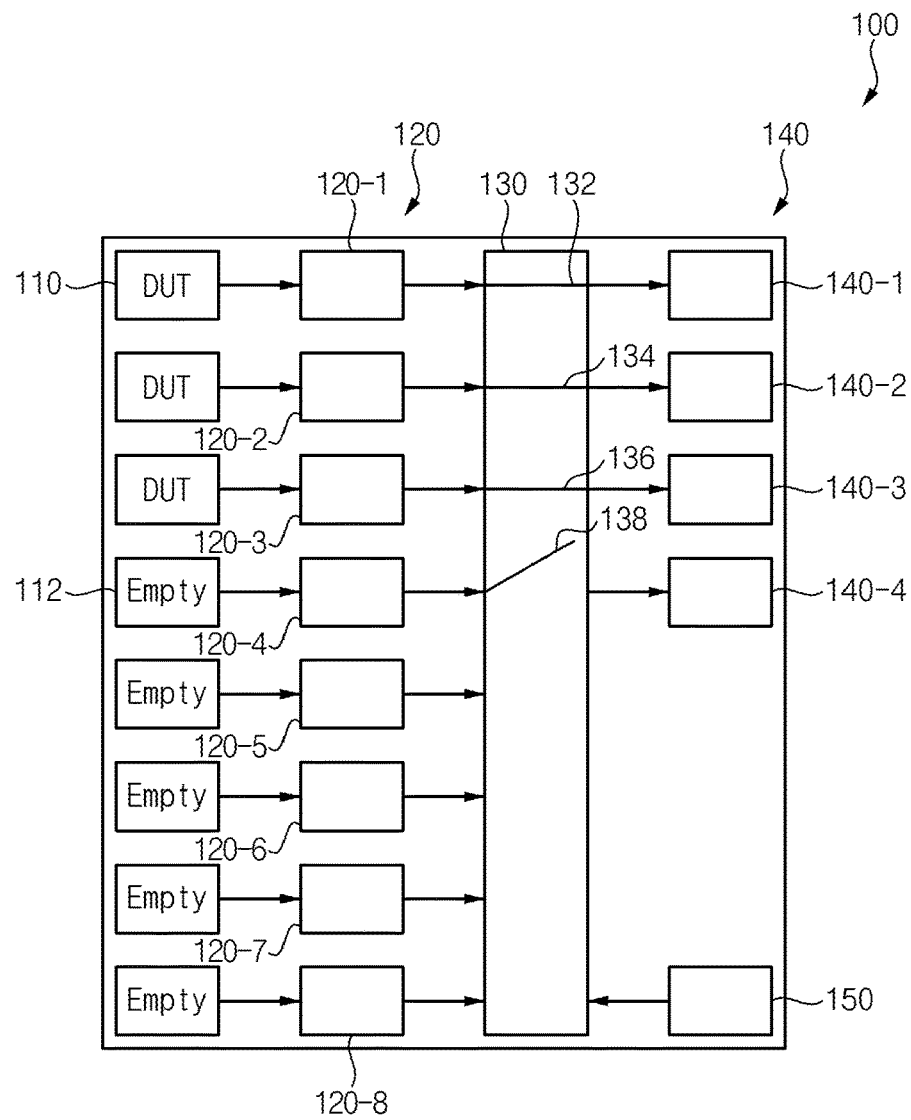

FIG. 2 is a block diagram illustrating a tester applied to DUTs at an edge portion of a wafer in accordance with example embodiments. Referring to FIG. 2, when the tester 100 may be applied to the DUTs 110 at an edge portion of the wafer, a part of the probe card may not be connected to the DUTs 110. That is, when a portion of the probe card may be positioned in a region beyond the edge portion of the wafer, the portion of the probe card may not make contact with the DUTs 110 because DUTs may not exist in the region. Thus, no signal analysis circuits 120 may be connected to the DUTs 110. A part of the signal analysis circuits 120 may be connected to the DUTs 110.

In example embodiments, the three DUTs 110 may be positioned at the edge portion of the wafer. Thus, the first to third signal analysis circuits 120-1, 120-2 and 120-3 may be connected to the DUTs 110. In contrast, the fourth to eighth signal analysis circuits 120-4, 120-5, 120-6, 120-7 and 120-8 may not be connected to the DUTs 110. That is, the fourth to eighth signal analysis circuits 120-4, 120-5, 120-6, 120-7 and 120-8 may be connected to empty regions where the DUTs 110 may not exist.

The switch controller 150 may detect the connection between the first to third signal analysis circuits 120-1, 120-2 and 120-3 and the DUTs 110. Further, the switch controller 150 may detect the disconnection between the fourth signal analysis circuit 120-4 and a DUT 110. The switch array 130 may connect the first to third signal analysis circuits 120-1, 120-2 and 120-3 connected to the DUTs 110 with the first to third signal processing units 140-1, 140-2 and 140-3 by the control of the switch controller 150. Particularly, the first switch 132 may connect the first signal analysis circuit 120-1 connected to the DUT 110 with the first signal processing unit 140-1. The second switch 134 may connect the second signal analysis circuit 120-2 connected to the DUT 110 with the second signal processing unit 140-2. The third switch 136 may connect the third signal analysis circuit 120-3 connected to DUT 110 with the third signal processing unit 140-3. In contrast, the fourth switch 138 may not connect the fourth signal analysis circuit 120-4, which may not be connected to a the DUT 110, with the fourth signal-processing unit 140-4. That is, the fourth switch 138 may block any electrical connection between the fourth signal analysis circuit 120-4 and the fourth signal-processing unit 140-4. Thus, the signal-processing unit 140, which may not be connected to the DUT 110, may not be used. Advantageously, the non-used signal-processing unit 140 may be utilized for the signal-processing unit 140 of the other tester 100, as explained more fully hereinbelow.

Figure 3:
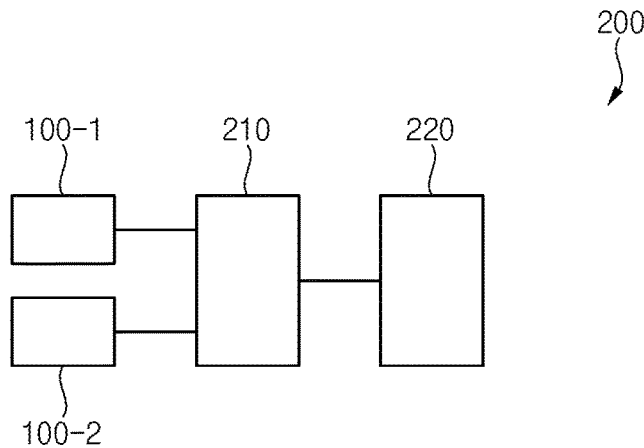

FIG. 3 is a block diagram illustrating a test system including the tester in FIG. 2. Referring to FIG. 3, a test system 200 may include a plurality of testers, a switch hub 210 and a signal-processing server 220. In example embodiments, the testers may be two, however other numbers of testers may be used. The testers may include a first tester 100-1 and a second tester 100-2. The first tester 100-1 and the second tester 100-2 may form one test group TG. Each of the first and second testers 100-1 and 100-2 may be substantially the same as the tester in FIGS. 1 and 2. Thus, any further illustrations with respect to the first and second testers 100-1 and 100-2 may be omitted herein for brevity.

The switch hub 210 may be electrically connected with the first and second testers 100-1 and 100-2. The switch hub 210 may be configured to electrically connect the switch arrays 130 in the first and second testers 100-1 and 100-2 with each other. Thus, information of the switch arrays 130 in the first and second testers 100-1 and 100-2 may be reciprocally exchanged through the switch hub 210. Because the signal processing units 140 may be selectively connected to the DUTs 110 by the switch array 130, information of the signal processing units 140 may also be reciprocally exchanged through the switch hub 210. For example, when the signal-processing unit 140, which may not be connected to the DUT 110 by any one of the switch array 130, may exist in the first tester 100-1, this information of the signal-processing unit 140 may be transmitted to the second tester 100-2 through the switch hub 210. Further, when the numbers of the signal processing units 140 in the second tester 100-2 may be less than the numbers of the DUTs 110 to be tested, this information may be transmitted to the first tester 100-1 through the switch hub 210. The signal-processing server 220 may be connected to the switch hub 210. The signal-processing server 220 may control the operations of the first and second testers 100-1 and 100-2 and the switch hub 210. Further, the signal-processing server 220 may store information processed by the first and second testers 100-1 and 100-2 and the switch hub 210.

Figure 4:
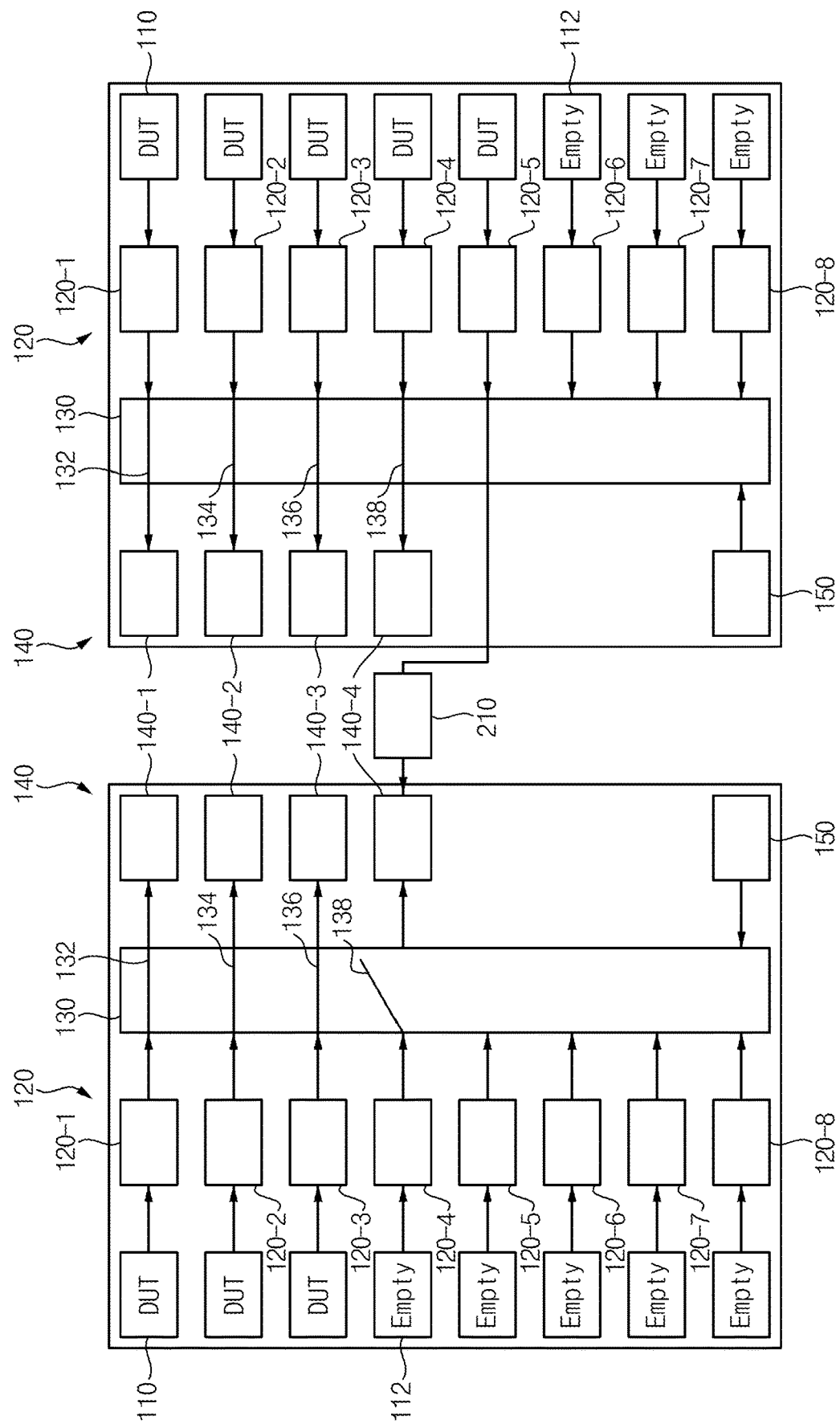

FIG. 4 is a block diagram illustrating an operation of utilizing signal-processing units by a signal-processing server in FIG. 3. Referring to FIG. 4, as mentioned with reference FIG. 2, the fourth switch 138 of the first tester 100-1 may not connect the fourth signal analysis circuit 140, which may not be connected to the DUT 110, with the fourth signal-processing unit 140-4. When the numbers of the DUTs 110 tested using the second tester 100-2, which may include the four signal processing units 140, may be five, the fourth signal-processing unit 140-4 of the first tester 100-1 may be utilized for an additional signal-processing unit 140 of the second tester 100-2. That is, the fourth signal-processing unit 140-4 of the first tester 100-1 may be utilized for a fifth signal-processing unit of the second tester 100-2 to test the fifth DUT 110. In this case, the switch array 130 of the second tester 100-2 may electrically connect the fourth signal-processing unit 140-4 of the first tester 100-1 with the fifth DUT 110.

Figure 5:
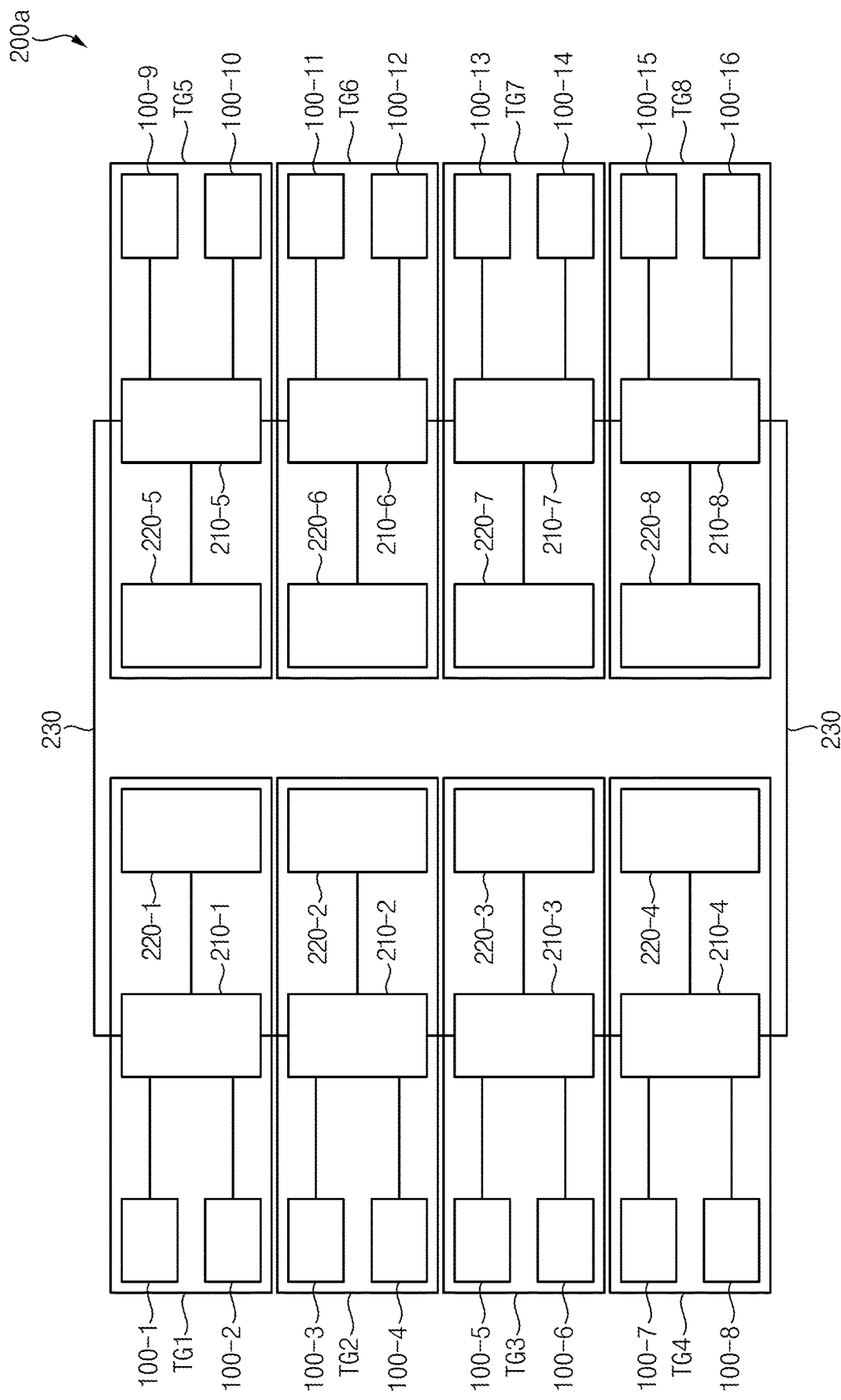

FIG. 5 is a block diagram illustrating a test system in accordance with example embodiments. Referring to FIG. 5, a test system 200a of example embodiments may include a plurality of tester groups. In example embodiments, the tester groups may include first to eighth tester groups TG1, TG2, TG3, TG4, TG5, TG6, TG7 and TG8. Particularly, the first test group TG1 may include first and second testers 100-1 and 100-2. The second test group TG2 may include third and fourth testers 100-3 and 100-4. The third test group TG3 may include fifth and sixth testers 100-5 and 100-6. The fourth test group TG4 may include seventh and eighth testers 100-7 and 100-8. The fifth test group TG5 may include ninth and tenth testers 100-9 and 100-10. The sixth test group TG6 may include eleventh and twelfth testers 100-11 and 100-12. The seventh test group TG7 may include thirteenth and fourteenth testers 100-13 and 100-14. The eighth test group TG8 may include fifteenth and sixteenth testers 100-15 and 100-16. That is, the test system 200a may include the first to sixteenth testers 100-1, 100-2, 100-3, 100-4, 100-5, 100-6, 100-7, 100-8, 100-9, 100-10, 100-11, 100-12, 100-13, 100-14, 100-15 and 100-16. The first to sixteenth testers 100-1, 100-2, 100-3, 100-4, 100-5, 100-6, 100-7, 100-8, 100-9, 100-10, 100-11, 100-12, 100-13, 100-14, 100-15 and 100-16 may be substantially the same as the tester 100 in FIGS. 1 and 2. Thus, any further illustrations with respect to the first to sixteenth testers 100-1, 100-2, 100-3, 100-4, 100-5, 100-6, 100-7, 100-8, 100-9, 100-10, 100-11, 100-12, 100-13, 100-14, 100-15 and 100-16 may be omitted herein for brevity.

A first switch hub 210-1 may be connected to the first tester group TG1. A first signal-processing server 220-1 may be connected to the first switch hub 210-1. A second switch hub 210-2 may be connected to the second tester group TG2. A second signal-processing server 220-2 may be connected to the second switch hub 210-2. A third switch hub 210-3 may be connected to the third tester group TG3. A third signal-processing server 220-3 may be connected to the third switch hub 210-3. A fourth switch hub 210-4 may be connected to the fourth tester group TG4. A fourth signal-processing server 220-4 may be connected to the fourth switch hub 210-4. A fifth switch hub 210-5 may be connected to the fifth tester group TG5. A fifth signal-processing server 220-5 may be connected to the fifth switch hub 210-5. A sixth switch hub 210-6 may be connected to the sixth tester group TG6. A sixth signal-processing server 220-6 may be connected to the sixth switch hub 210-6. A seventh switch hub 210-7 may be connected to the seventh tester group TG7. A seventh signal-processing server 220-7 may be connected to the seventh switch hub 210-7. An eighth switch hub 210-8 may be connected to the eighth tester group TG8. An eighth signal-processing server 220-8 may be connected to the eighth switch hub 210-8. The first to eighth switch hubs 210-1, 210-2, 210-3, 210-4, 210-5, 210-6, 210-7 and 210-8 and the first to eighth signal processing servers 220-1, 220-2, 220-3, 220-4, 220-5, 220-6, 220-7 and 220-8 may be substantially the same as the switch hub 210 and the signal processing server 220 in FIG. 3, respectively. Thus, any further illustrations with respect to the first to eighth switch hubs 210-1, 210-2, 210-3, 210-4, 210-5, 210-6, 210-7 and 210-8 and the first to eighth signal processing servers 220-1, 220-2, 220-3, 220-4, 220-5, 220-6, 220-7 and 220-8 may be omitted herein for brevity.

The first to eighth switch hubs 210-1, 210-2, 210-3, 210-4, 210-5, 210-6, 210-7 and 210-8 may be connected with each other via a shared line 230. Thus, information of the first to sixteenth testers 100-1, 100-2, 100-3, 100-4, 100-5, 100-6, 100-7, 100-8, 100-9, 100-10, 100-11, 100-12, 100-13, 100-14, 100-15 and 100-16 may be reciprocally exchanged through the shared line 230. As a result, all the DUTS 110 may be connected to all the signal-processing units 140 in the first to eighth tester groups TG1, TG2, TG3, TG4, TG5, TG6, TG7 and TG8 through the shared line 230. Therefore, the utilization of the signal processing units 140 in the first to eighth tester groups TG1, TG2, TG3, TG4, TG5, TG6, TG7 and TG8 may be shared with each other.

Figure 6:
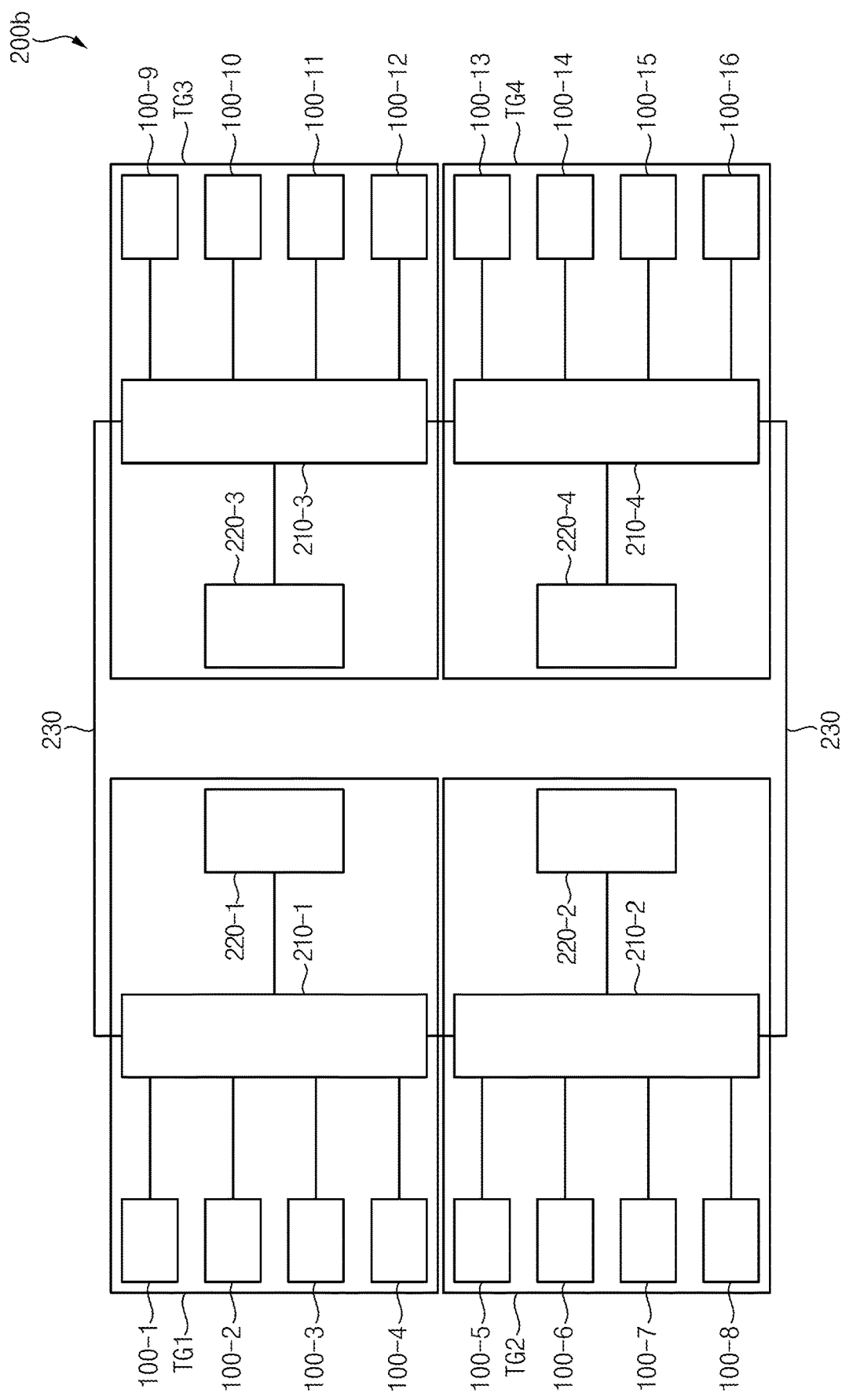

FIG. 6 is a block diagram illustrating a test system in accordance with example embodiments. Referring to FIG. 6, a test system 200*b* of example embodiments first to fourth tester groups TG1, TG2, TG3 and TG4. Particularly, the first test group TG1 may include first to fourth testers 100-1, 100-2, 100-3 and 100-4. The second test group TG2 may include fifth to eighth testers 100-5, 100-6, 100-7 and 100-8. The third test group TG3 may include ninth to twelfth testers 100-9 and 100-12. The fourth test group TG4 may include thirteenth to sixteenth testers 100-13, 100-14, 100-15 and 100-16.

A first switch hub 210-1 may be connected to the first tester group TG1. A first signal-processing server 220-1 may be connected to the first switch hub 210-1. A second switch hub 210-2 may be connected to the second tester group TG2. A second signal-processing server 220-2 may be connected to the second switch hub 210-2. A third switch hub 210-3 may be connected to the third tester group TG3. A third signal-processing server 220-3 may be connected to the third switch hub 210-3. A fourth switch hub 210-4 may be connected to the fourth tester group TG4. A fourth signal-processing server 220-4 may be connected to the fourth switch hub 210-4.

The first to fourth switch hubs 210-1, 210-2, 210-3 and 210-4 may be connected with each other via a shared line 230. Thus, information of the first to sixteenth testers 100-1, 100-2, 100-3, 100-4, 100-5, 100-6, 100-7, 100-8, 100-9, 100-10, 100-11, 100-12, 100-13, 100-14, 100-15 and 100-16 may be reciprocally exchanged through the shared line 230. As a result, all the DUTS 110 may be connected to all the signal-processing units 140 in the first to fourth tester groups TG1, TG2, TG3 and TG4 through the shared line 230. Therefore, the utilization of the signal processing units 140 in the first to fourth tester groups TG1, TG2, TG3 and TG4 may be shared with each other.

In example embodiments, the tester group may include the two or four testers 100, but is not limited thereto. For example, the tester group may include the three or at least five testers 100.

According to example embodiments, the switch array may cut off the connection of any one among connections between the signal analysis circuits, which may not be connected to the DUT, and the signal processing units. Thus, the DUTs may be tested using the signal processing units having numbers less than numbers of the DUTs. Furthermore, advantageously, the single switch hub may be connected with the at least two testers so that the signal processing unit in any one of the testers may be utilized for the signal processing unit of the other tester. As a result, numbers of the signal processing units may be decreased to reduce costs of the tester and the test system.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A tester adapted to test a device under test (DUT) within a semiconductor wafer, comprising:
    a first plurality of signal analysis circuits configured to analyze signals generated by a plurality of DUTs;

a second plurality of signal processing units configured to process the signals analyzed by the first plurality of signal analysis circuits; and a switch array electrically coupled between the first plurality of signal analysis circuits and the second plurality of signal processing units, said switch array configured to electrically connect selected ones of the first plurality of signal analysis circuits with corresponding ones of the second plurality of signal processing units; and a switch controller configured to detect electrical connections between the DUTs and the first plurality of signal analysis circuits and selectively disable a switch within the switch array, which extends between a signal processing unit within the second plurality thereof and an inactive one of the first plurality of signal analysis circuits, which is electrically disconnected from a DUT;

wherein the switch array is responsive to signals generated by the switch controller; and wherein the number of signal processing units within the second plurality is less than a maximum number of DUTs that can be connected to the first plurality of signal analysis circuits when the tester is testing a plurality of the DUTs, and the switch controller is configured to always maximize the number of DUTs that can be simultaneously tested at a number equivalent to the total number of signal processing units within the second plurality thereof whenever the number of untested DUTs within the plurality thereof, which are electrically connected to corresponding ones of the signal analysis circuits, is greater than the number of signal processing units within the second plurality thereof.

2. The tester of claim 1, wherein the switch array is configured to provide electrical connections between each of the second plurality of the signal processing units and a corresponding one of the first plurality of signal analysis circuits that is connected to a DUT, in response to signals generated by the switch controller.

3. The tester of claim 1, wherein the switch array is configured to block an electrical connection between a signal processing unit and a signal analysis circuit that is disconnected from a DUT.

4. The tester of claim 1, wherein the switch array has a plurality of switches therein, which can be selectively enabled to provide an electrical connection between a corresponding signal analysis circuit and a corresponding signal processing unit.

5. The tester of claim 4, wherein a number of the plurality of switches within the switch array is equivalent to the number of the signal processing units within the second plurality thereof.

6. The tester of claim 1, wherein the signal analysis circuits comprise field programmable gate arrays (FPGAs).

7. The tester of claim 1, wherein the signal processing units comprise graphic processing units (GPUs).

8. A test system, comprising:

a first tester including: (i) first signal analysis circuits configured to analyze signals outputted from first devices under test (DUTs) of a wafer, (ii) first signal processing units configured to process signals analyzed by the first signal analysis circuits, and (iii) a first switch array arranged between the first signal analysis circuits and the first signal processing units, said first switch array configured to selectively connect the first signal analysis circuits with the first signal processing units in accordance with electrical connections between the first DUTs and the first signal analysis circuits;

a second tester including: (i) second signal analysis circuits configured to analyze signals outputted from second DUTs of a wafer, (ii) second signal processing units configured to process signals analyzed by the second signal analysis circuits, and (iii) a second switch array arranged between the second signal analysis circuits and the second signal processing units, said second switch array configured to selectively connect the second signal analysis circuits with the second signal processing units in accordance with electrical connections between the second DUTs and the second signal analysis circuits; and a switch hub electrically connected to the first and second testers, said switch hub configured to route signals that are: (i) analyzed by one of the second signal analysis circuits, which receives signals outputted by one of the second DUTs, and (ii) pass through the second switch array to one of the first signal processing units within the first tester, in response to a detection that a number of second DUTs connected to the second signal analysis circuits exceeds a maximum number of the second signal processing units and at least one of the first signal processing units is available because a number of first DUTs connected to the first signal analysis circuits is less than a maximum number of the first signal processing units.

9. The test system of claim 8, further comprising a signal-processing server connected to the switch hub.

10. The test system of claim 8, wherein the first tester includes a first switch controller configured to detect the connections between the first DUTs and the first signal analysis circuits.

11. The test system of claim 8, wherein the first and second signal processing units include graphic processing units (GPUs).

* * * * *